United States Patent
Sipilä et al.

(10) Patent No.: US 7,660,393 B2
(45) Date of Patent: Feb. 9, 2010

(54) GAS TIGHT RADIATION WINDOW, AND A METHOD FOR ITS MANUFACTURING

(75) Inventors: Heikki Johannes Sipilä, Espoo (FI); Seppo Nenonen, Espoo (FI)

(73) Assignee: Oxford Instruments Analytical Oy (FI)

( * ) Notice: Subject to any disclaimer, the term of this patent is extended or adjusted under 35 U.S.C. 154(b) by 185 days.

(21) Appl. No.: 11/820,433

(22) Filed: Jun. 19, 2007

(65) Prior Publication Data

US 2008/0317209 A1  Dec. 25, 2008

(51) Int. Cl.
*H01J 5/18* (2006.01)
(52) U.S. Cl. ......................... 378/140; 359/275
(58) Field of Classification Search .............. 378/140, 378/161; 250/505.1; 359/359, 275
See application file for complete search history.

(56) References Cited

U.S. PATENT DOCUMENTS 4,178,509 A * 12/1979 More et al. ................. 250/374
6,369,934 B1 * 4/2002 Bechinger et al. ........... 359/265

FOREIGN PATENT DOCUMENTS

GB       2 266 787 A    11/1993

* cited by examiner

*Primary Examiner*—Hoon Song
(74) *Attorney, Agent, or Firm*—Wood, Phillips, Katz, Clark & Mortimer

(57) ABSTRACT

A gas tight radiation window membrane comprises a layered diffusion barrier with a reactive metal layer (201) covered on both sides by cover layers (202, 203). An originally continuous carrier layer (101) can be made a mesh that has openings coincident with openings of a reinforcement grid (105), while the gas tight diffusion barrier (107, 507) spans as a continuous film over said openings in said mesh.

17 Claims, 5 Drawing Sheets

GAS TIGHT RADIATION WINDOW, AND A METHOD FOR ITS MANUFACTURING

TECHNICAL FIELD

The invention concerns in general the technology of radiation windows used as gastight seals in openings that must allow X-rays to go through.

BACKGROUND OF THE INVENTION

X-ray tubes, gas-filled X-ray detectors and various other applications require window materials with which it is possible to seal an opening in a gastight manner, while still letting X-rays of at least some desired wavelength range pass through the window with as little attenuation as possible. Another requirement for the window material is its ability to stand a certain amount of mechanical stress, because the pressure difference between the different sides of the window may be considerable.

In this description we use the term "film" to mean a thin material layer of uniform thickness, and the term "membrane" to mean generally a structure that is relatively thin, i.e. has a very small overall dimension in one direction compared to its dimensions in the other, perpendicular dimensions. A membrane may consist of several materials and may have significant local variations in its thickness, and may exhibit structural topology, such as reinforcement ridges.

A prior art membrane structure for radiation windows is known from the patent publication GB 2 266 787 A. FIG. 1 illustrates the corresponding manufacturing method, although schematically only and not to scale. A thin polyimide film 101 is first manufactured on the surface of a substrate 102. The thickness of the polyimide film 101 may be e.g. in the order of 300 nanometers. A thick layer 103 of a photoresist is spread onto the polyimide film 101, and exposed through an exposure mask 104. Here we assume that the photoresist layer 103 consists of a positive resist, which means that the exposed portions will be dissolved, leaving a reinforcement grid 105 attached to the thin polyimide film 101. A negative resist could be used as well, but since the aim is to produce the grid 105, using a negative resist would necessitate forming the exposure mask 104 differently so that it would allow the beam parts of the grid to be exposed instead of the opening parts like in FIG. 1. Finally the substrate is etched away, possibly leaving an attachment ring 106 made of the substrate material at the edges. The thickness of the reinforcement grid 105 can be several micrometers, or even 15 micrometers.

Polyimide is not very gastight by itself, so a so-called diffusion barrier layer 107 is usually made on the even surface of the thin polyimide film 101. Known materials for the diffusion barrier layer 107 include but are not limited to ceramic materials and diamond. These have very advantageous properties in terms of producing a very gastight membrane, but they are also very hard and brittle. A more ductile diffusion barrier layer can be made by first depositing a thin layer (like 40 nanometers) of aluminum nitride 108 onto the even surface of the thin polyimide film 101 and covering it with a layer of pure aluminum 109.

Prior art window membranes like that shown in FIG. 1 exhibit certain disadvantageous properties. Selecting the thicknesses of the polyimide film 101 and the diffusion barrier layer 107 is an awkward tradeoff: the thicker the layers, the better tightness can be achieved, however with the associated increase in X-ray attenuation. When an optimally thin diffusion barrier layer is aimed at, it may happen that a small pinhole is left in the diffusion barrier layer materials, or a grain boundary is created through which gas molecules can penetrate the diffusion barrier layer, causing leakage.

SUMMARY OF THE INVENTION

An objective of the present invention is to present a radiation window that is very gastight. Another objective of the invention is to present a method for manufacturing such a radiation window. An additional objective of the invention is to present a gastight radiation window that avoids the brittleness problems of hard diffusion barrier layers. Yet another objective of the invention is to decrease attenuation in a radiation window without sacrificing mechanical strength or gas impermeability.

The objectives of the invention are achieved by using a reactive metal in the diffusion barrier layer. Certain objectives of the invention are also achieved by selectively removing certain portions of a previously continuous carrier layer.

According to a first aspect of the invention, a gas tight radiation window membrane is characterized by a layered diffusion barrier that comprises a reactive metal layer covered on both sides by cover layers.

According to a second aspect of the invention, a gas tight radiation window membrane comprises a carrier layer, a gas tight diffusion barrier layer and a reinforcement grid on a second side of said carrier layer; and is characterized by the carrier layer being a mesh that has openings coincident with openings of said reinforcement grid, while the gas tight diffusion barrier spans as a continuous film over said openings in said mesh.

According to the first aspect of the invention a method for manufacturing a radiation window membrane comprises producing a carrier layer and producing a layered diffusion barrier on one side of said carrier layer; and is characterized in that producing said layered diffusion barrier comprises producing a reactive metal layer covered on both sides by cover layers.

According to the second aspect of the invention a method for manufacturing a radiation window membrane comprises producing a continuous polymer layer that constitutes a carrier layer, producing a diffusion barrier and a mechanical reinforcement layer that is continuous over the whole area of the membrane on one side of said carrier layer, and producing a reinforcement grid on a side of said carrier layer that is different than the side on which the diffusion barrier and the mechanical reinforcement layer are produced; and is characterized by removing parts of the continuous polymer layer, thus making the carrier layer a mesh that has openings coincident with openings of said reinforcement grid.

A reactive metal is one that is a strong reducing agent, such as of an oxide. When a reactive metal gets in touch with a medium contain oxygen, such as air or water, an oxidization reaction takes place very quickly. Some of the known reactive metals are not suitable for use in X-ray radiation windows, because their handling is too difficult, or the interaction characteristics of the materials with X-rays are such that they cause too much attenuation and/or give rise to fluorescent X-ray peaks that overlap with the characteristic peaks of target materials that should be examined.

However, reactive metals that do have acceptable characteristics in terms of attenuation and fluorescence exist, and enable building a novel layered diffusion barrier structure, in which a layer of reactive metal is encapsulated between protective layers that originally keep the reactive metal from interacting with any surrounding medium. If a pinhole, a grain border or other local defect in a protective layer allows oxygen to reach the reactive metal, an oxidization reaction occurs and produces a local concentration of an oxide that has the tendency of sealing the gap through which the gas molecules came. Thus the layered diffusion barrier structure is auto-sealing in the sense that it stops any occurring leaks automatically.

Reactive metals that fulfill the criteria of low attenuation at soft X-rays and absence of interfering characteristic peaks include at least lanthanum, lithium, cesium, and barium. Compounds that have similar properties and could thus be used as the reactive liner of a layered diffusion barrier include at least lanthanum oxide and cesium iodide.

Surprisingly, it has also been found that at least some of the layers of layered diffusion barrier structures have a mechanical strength that exceeds that of the film made of polyimide or other polymer that has traditionally been used as the carrier layer of the radiation window. A continuous carrier layer may not be needed at all, after it has performed its duty as the base onto which the layers of the diffusion barrier have been formed. Removing the unnecessary portions of the carrier layer through plasma etching or other suitable technique helps to reduce the attenuation of X-rays in the radiation window.

The exemplary embodiments of the invention presented in this patent application are not to be interpreted to pose limitations to the applicability of the appended claims. The verb "to comprise" is used in this patent application as an open limitation that does not exclude the existence of also unrecited features. The features recited in depending claims are mutually freely combinable unless otherwise explicitly stated.

The novel features which are considered as characteristic of the invention are set forth in particular in the appended claims. The invention itself, however, both as to its construction and its method of operation, together with additional objects and advantages thereof, will be best understood from the following description of specific embodiments when read in connection with the accompanying drawings.

DETAILED DESCRIPTION OF THE INVENTION

Figure 2:
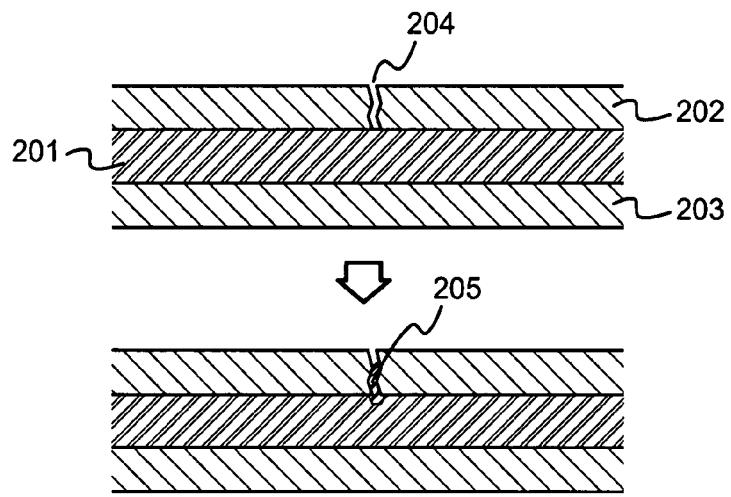
FIG. 2 illustrates a layered diffusion barrier structure.

FIG. 2 illustrates schematically a layered diffusion barrier structure, in which a reactive metal layer 201 is covered on both top and bottom sides with top and bottom cover layers 202 and 203 respectively. Initially there is a crack 204 in the top cover layer 202, which allows the surrounding substance to come in touch with a small portion of the reactive metal layer. The dimensions of the crack 204 are on the molecular level, so macroscopically the top cover layer 202 still seems to be intact.

We may assume that the surrounding substance is air that contains oxygen both in free oxygen molecules and in compounds like water vapor, carbon dioxide and the like. Molecules of the surrounding substance cause a chemical reaction in the reactive metal. Although the chemical reaction may include various reacting mechanisms, for simplicity we may say that atoms of the reactive metal oxidize so that a certain amount of oxide is created. The lower portion of FIG. 2 illustrates schematically how the oxide (and/or possible other reaction results) creates a plug 205 that fills the crack and stops further molecules of the surrounding medium from leaking through the crack.

To be quite exact, metals cannot be directly categorized into "reactive" and "non-reactive", because they exhibit reactivity in various amounts. In the periodic table of elements reactivity tends to increase downwards in groups I and II. On the same period, the group I metal is more reactive than the group II metal, which in turn is more reactive than the group III metal, and these three are all more reactive than the transition metals of that period. It has become customary to use the designation "reactive metals" to mean metallic substances the reactivity of which is strong enough to have a major role in characterizing the metal's use under normal atmospheric conditions. Examples of commonly used metals, that in a reactivity scale would qualify as more reactive than the non-metallic reference material carbon, include in a decreasing order of reactivity, potassium, sodium, calcium, magnesium and aluminum.

The common reactive metals named above are not well suited for use as the reactive metal of a layered diffusion barrier structure of a radiation window. Potassium, sodium and calcium react too strongly. Aluminum and magnesium are quick to react as such, but very soon develop a uniform oxide coating on the exposed surface. This oxide coating only reaches to a depth of some nanometers and makes oxidized aluminum and magnesium behave more like inert metals.

The reactive metal layer that is enclosed between the cover layers may be called a reactive liner. Reactive metals that are good for use as the reactive liner of the layered diffusion barrier structure of FIG. 2 include at least lanthanum, lithium, cesium, and barium. The absorption of soft X-rays (energy range 180 eV-1 keV) is relatively small in these elements, and the characteristic energies are at values that do not disturb any X-ray fluorescence measurements (lanthanum: K absorption edge at 38.9 keV, K-line energies at 33.4-37.8 keV, L-line energies at 4.651 and 5.043 keV; lithium: K absorption edge at 55 eV; cesium: K absorption edge at 36.0 keV, K-line energies at 31.0-35.0 keV, L-line energies at 4.286 and 4.620 keV; barium: K absorption edge at 37.4 keV, K-line energies at 32.2-36.4 keV, L-line energies at 4.467 and 4.828 keV). Compounds that have similar properties and could thus be used as the reactive liner of a layered diffusion barrier include at least lanthanum oxide and cesium iodide. Of the named substances, lithium is almost as strongly reactive as sodium and requires very careful handling in the manufacturing process. Lanthanum oxide is strongly hygroscopic, which can cause problems if water vapor is abundant in the surrounding air.

The selection of the material for the top and bottom cover layers 202 and 203 is not very important to the invention, but a straightforward choice is aluminum. Criteria for good cover layer materials include low absorption of X-rays, good gas impermeability, stability under environmental conditions, and easy use in manufacturing processes that include producing thin layers. The thickness of the reactive liner layer 201 is typically in the order of 10-100 nanometers, and each of the two layers 202 and 203 may have a thickness in the order of 5-20 nanometers. Selecting the layer thicknesses is a trade-off between gas impermeability and transmissivity to X-rays.

The thicker the layers are, the more gastight the radiation window will assumedly be, but the larger is also the absorption of X-rays in the window membrane. In X-ray tubes it is possible to compensate for higher absorption by increasing the X-ray tube current, which in turn increases the flux of incident X-rays.

Figure 1:
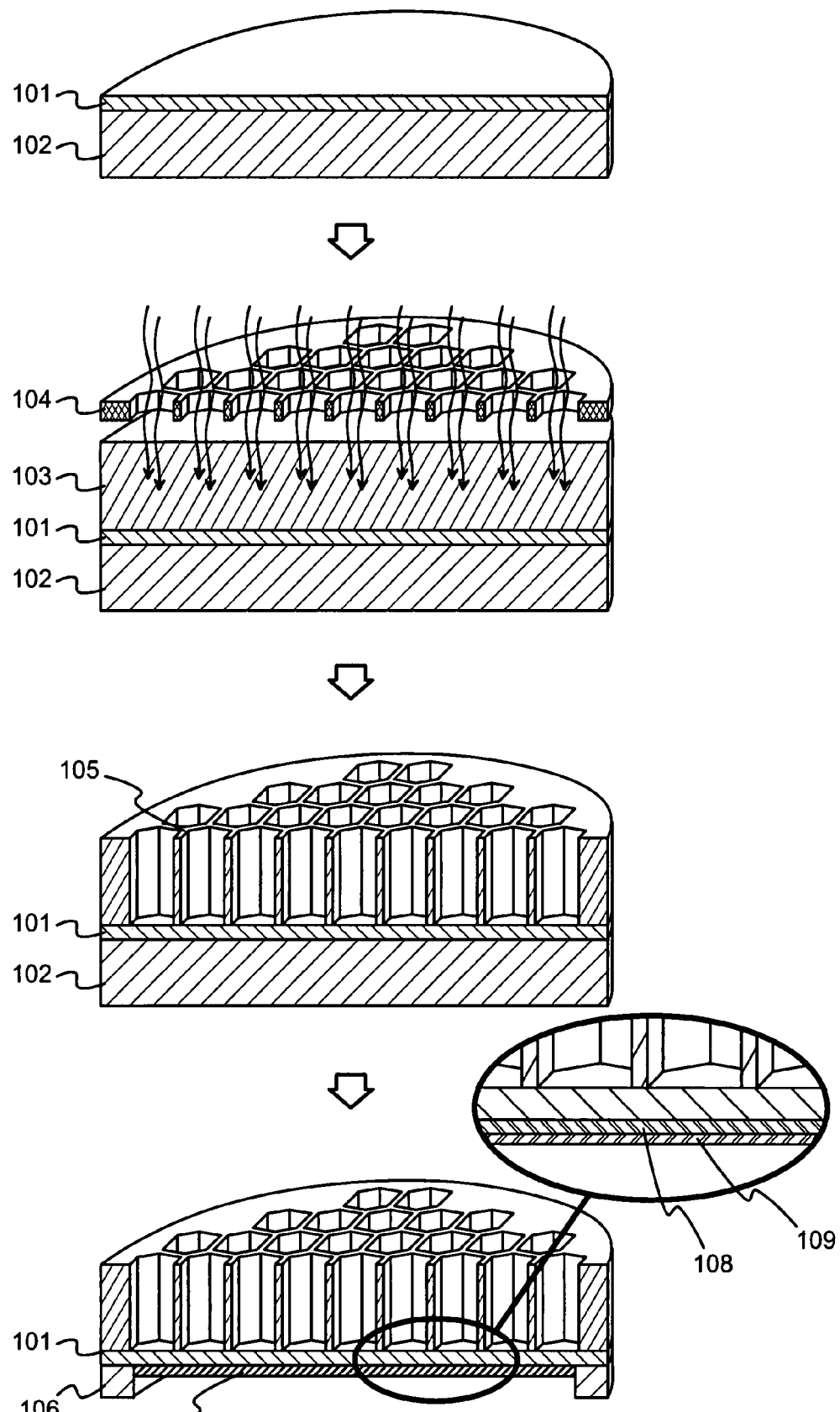
FIG. 1 illustrates the manufacture of a prior art radiation window.
Figure 3:
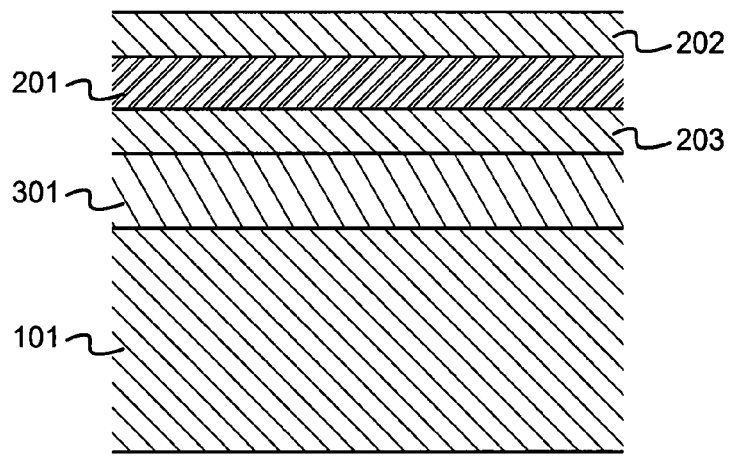
FIG. 3 illustrates a radiation window membrane equipped with a layered diffusion barrier structure.

FIG. 3 is a cross-section of a radiation window membrane according to an embodiment of the invention. The membrane comprises a carrier layer 101, which may be for example a polyimide layer with a thickness in the order of some hundreds of nanometers, like was described earlier with reference to the prior art technology of FIG. 1. On one surface of the carrier layer 101 there is an optional aluminum nitride layer 301 that acts as the mechanical reinforcement layer, and on top thereof is a layered diffusion barrier layer similar to that of FIG. 2, with a reactive liner 201 sandwiched between top and bottom cover layers 202 and 203 respectively. If the structure includes an aluminum nitride layer, the order of layers from top to bottom could also be aluminum nitride-aluminum-reactive metal-aluminum-polyimide; in other words the mechanical reinforcement layer made of aluminum nitride may be on any side (or even both sides) of the layered diffusion barrier.

Figure 4:
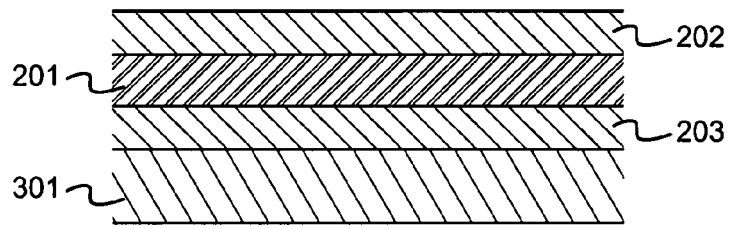
FIG. 4 illustrates another radiation window membrane equipped with a layered diffusion barrier structure.

Surprisingly, it has been found that the mechanical strength of aluminum nitride is so high compared to polyimide that if a membrane like that of FIG. 3 is subjected to mechanical stress (for example by lowering the pressure on one side of it to technical vacuum while keeping the other side at atmospheric pressure), the aluminum nitride layer carries a large majority of the load. Taken that the layers were produced by thin-film deposition techniques like sputtering, atomic layer deposition, or chemical vapor deposition, the carrier layer was needed during manufacture as the base onto which the other layers were grown. However, from a completed product it could be removed. FIG. 4 is a cross-section of a radiation window membrane according to another embodiment of the invention, which only contains the aluminum nitride layer 301 as well as a layered diffusion barrier layer similar to that of FIG. 2, with a reactive liner 201 sandwiched between top and bottom cover layers 202 and 203 respectively. A 300 nanometers layer of polyimide attenuates soft x-rays more than a 40 nanometers layer of aluminum nitride, so if the polyimide layer can be removed (even at the cost of requiring a couple of nanometers more to the thickness of the aluminum nitride layer), the overall attenuation of the radiation window membrane decreases.

Figure 5:
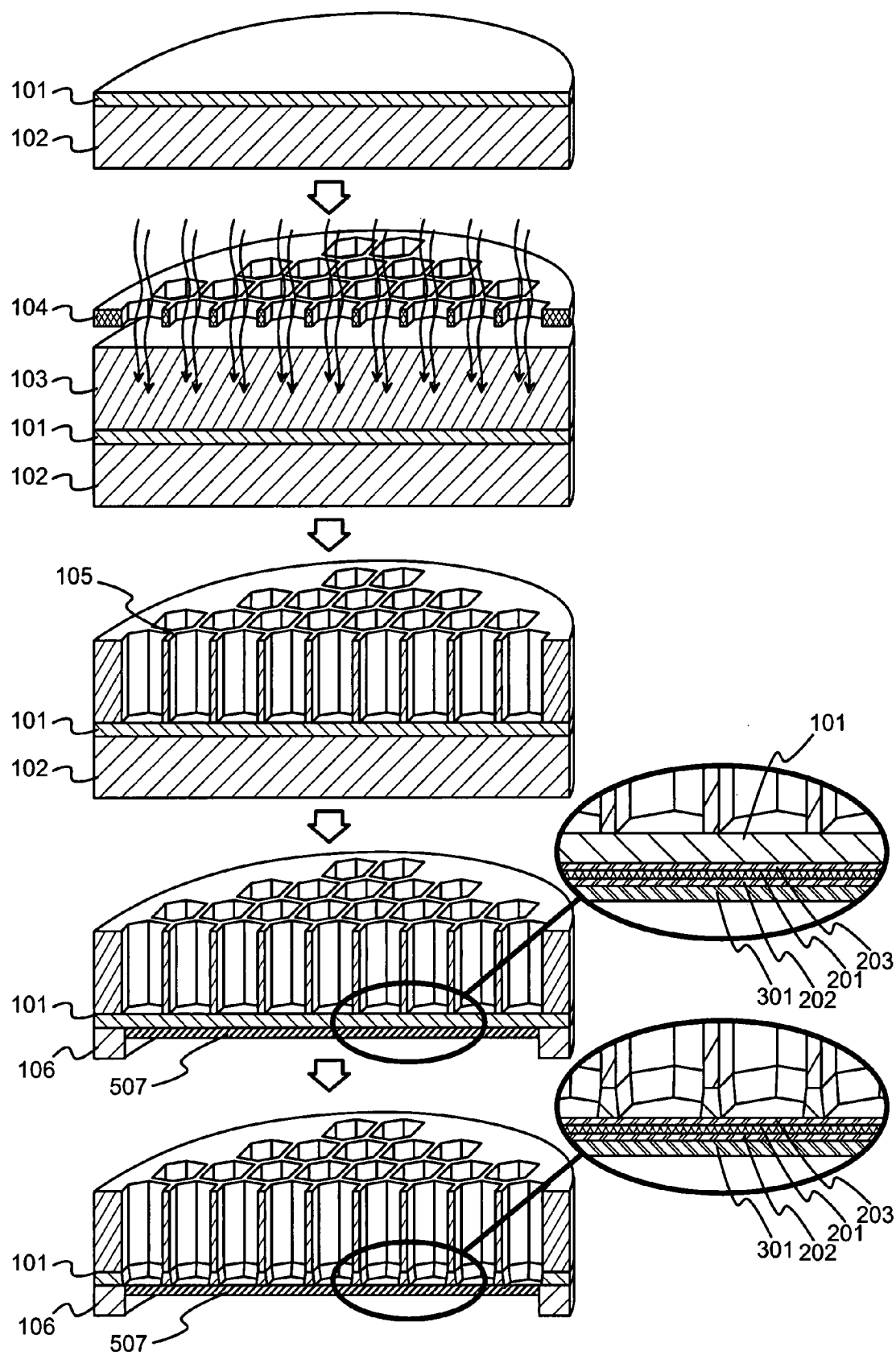
FIG. 5 illustrates the manufacture of a radiation window according to an embodiment of the invention.
Figure 6:
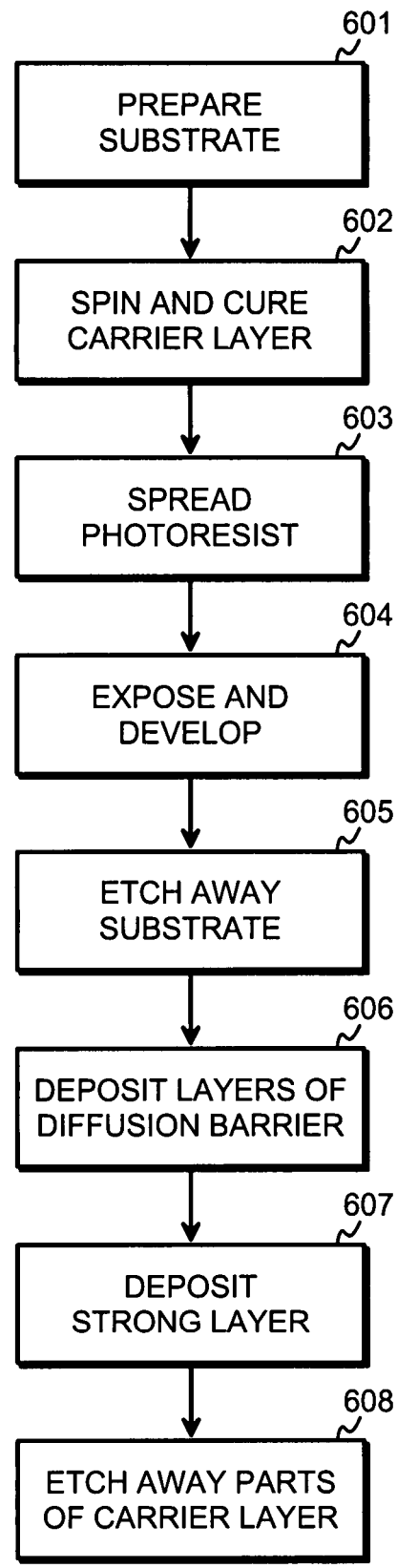
FIG. 6 illustrates a manufacturing method according to an embodiment of the invention.

FIGS. 5 and 6 illustrate the manufacture of a radiation window according to an embodiment of the invention. The process begins very much like the prior art process illustrated in FIG. 1: at step 601 there is prepared a substrate 102 of e.g. silicon, and at step 602 a thin (like 300 nm) carrier layer is produced on one surface of the substrate. A known advantageous way of producing the carrier layer is to spin a certain amount of a liquid polymer solution (like polyimide solution) on the surface and allowing it to cure. Other polymers than polyimide could be used, as is known in the art.

In order to produce a reinforcement grid there is spread at step 603 a relatively thick layer 103 of a photosensitive polymer onto the available surface of the carrier layer 101. At step 604 the photosensitive polymer is exposed through an exposure mask 104 and developed, causing the desired portions of the photosensitive polymer layer to remain attached to the carrier layer 101 as a reinforcement grid 105 while other portions of the photosensitive polymer are dissolved away. Here it should be again noted that while FIG. 5 illustrates the use of a polymer that acts like a positive photoresist, the same objective could be achieved by using a negative photoresist and a correspondingly formed exposure mask. At step 605 at least a major portion of the substrate 102 is etched away. In some cases it is advantageous to allow some edge portions of the substrate remain attached to the carrier layer 101 to constitute an attachment ring 106.

At step 606 the layers of the layered diffusion barrier structure 507 are deposited onto the flat surface of the carrier layer 101. These comprise the reactive liner 201 sandwiched between top and bottom cover layers 202 and 203 respectively. Here the "top" cover layer 202 is graphically shown under the reactive liner 201 and the "bottom" cover layer 203 is graphically shown above it. This serves to illustrate how direction-related terms like "top" and "bottom" only refer to some imaginary orientation and do not have any limiting effect. The "bottom" layer is the one below the reactive liner in the order of depositing the layers, while the "top" layer is only deposited after the reactive liner.

In the embodiment of FIGS. 5 and 6 the mechanical reinforcement layer 301 is only deposited at step 607 after creating the layered diffusion barrier structure 507. As was pointed out earlier in association with FIGS. 3 and 4, the mechanical reinforcement layer could also be between the layered diffusion barrier structure 507 and the carrier layer 101, so that steps 606 and 607 would take place in reverse order. Yet another possibility is to manufacture one mechanical reinforcement layer first on the surface of the carrier layer, then add a layered diffusion barrier, and finalize the structure with another mechanical reinforcement layer so that the layered diffusion barrier will eventually have a mechanical reinforcement layer on both sides of it. With a mechanical reinforcement layer we refer to that layer which will take the most of the mechanical stress. Previously we have referred to this layer as consisting of aluminum nitride, but it could also be made of other materials like Al2O3, TiO2, SiN, or TiN. One could even manufacture radiation windows without the mechanical reinforcement layer at all, if the pitch of the grid is small enough and if the carrier layer is strong enough.

Step 608 illustrates the optional step of removing the unnecessary portions of the carrier layer with e.g. plasma etching, thus making the carrier layer to constitute a mesh with openings coincident with the openings of the reinforcement grid. Another possibility is to make the carrier layer and the reinforcement grid of so much different substances that one can be wet etched while leaving the other intact, and to use wet etching to "open up" the bottoms of the shafts between the beam parts of the reinforcement grid 105. The partial enlargement to the right from the lowest part of FIG. 5 shows how between the beam parts of the reinforcement grid 105 the membrane only consists of the layered diffusion barrier arrangement (layers 201, 202, and 203) and the mechanical reinforcement layer 301.

Removing the carrier layer is not a mandatory step of the procedure; the carrier layer can be left as it is in a completed radiation window, or the removing step could be performed only partly so that only a part of the carrier layer will be removed (e.g. by selecting the exposure time in a plasma etching process to be short enough). Selecting whether to remove the carrier layer or not, or whether to remove it partly, and whether to use a mechanical reinforcement layer or even a number of mechanical reinforcement layers is a question of optimization, and closely related to choosing the pitch of the reinforcement grid. A larger pitch value means that the cavities between adjacent ridges in the reinforcement grid are wider, so that a larger area of the continuous foil needs to be self-supporting, and consequently the continuous foil (that consists of at least some of: a carrier layer, a layered diffusion barrier, one or more mechanical reinforcement layers) must have higher tensile strength. Simultaneously a larger pitch value means that a smaller relative portion of the radiation window is covered by the ridges of the reinforcement grid, at least if ridge width remains constant, which increases transmissivity because less radiation is absorbed in the ridges. When the size of the radiation window and the pressure difference that it must stand are known, it is possible to use e.g. experiments or theoretical calculations to find the optimal combination of the following factors:

how many, if any, mechanical reinforcement layers there are in the radiation window, is the carrier layer partly or completely removed from the cavities between ridges of the reinforcement grid, in which order the layered diffusion barrier and possible mechanical reinforcement layers appear in the structure, what is the pitch of the reinforcement grid and how wide are the ridges, and what is the thickness of each layer in the structure.

The embodiments discussed above are only examples of the invention and should not be considered as limiting. For example, even if the images show a hexagonal form for the reinforcement grid, the grid may have any convenient lattice-like pattern or even a pseudorandom criss-cross form, if it is necessary to avoid introducing any artificial regularity in the transmitted X-ray beam. Silicon has been mentioned as one possible substrate onto which the carrier layer is formed in the manufacturing process, but other possible substrates including but not being limited to copper and nickel could be used as well. Self-evident manufacturing steps such as washing, baking and polishing phases have been omitted in the description of the method, because such steps are in any case known to everyone who is familiar with e.g. the manufacturing process described in the mentioned prior art publication GB 2 266 787 A.

Parts of the description that say a layer to consist of a certain material mean that a major constituent of that layer is said material. For example, a layer "made of lanthanum" comprises lanthanum in a sufficiently high percentage so that the chemical behavior of said layer is essentially determined by its lanthanum content. For a person skilled in the art it is clear that it is physically impossible to make any layer to only consist of some material in an absolutely pure form.

Figure 7:
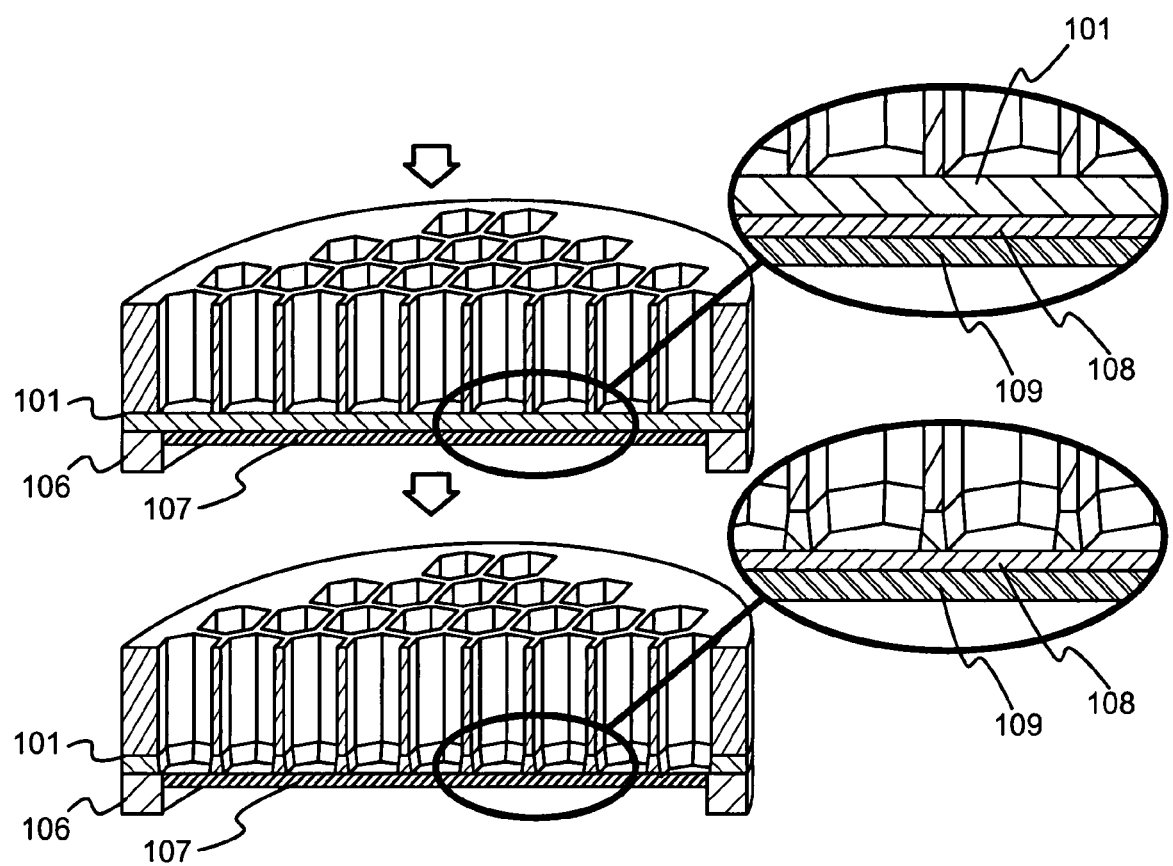
FIG. 7 illustrates some steps of manufacturing a radiation window according to another embodiment of the invention.

An important variation to the embodiments described so far is the application of the carrier-layer-removal principle to radiation windows that have some other kind of a diffusion-preventing arrangement than the layered diffusion barrier described above, or some other kind of a reinforcement grid. FIG. 7 illustrates certain phases of manufacturing a gas tight radiation window; we assume that these phases correspond roughly to the two lowest phases in FIG. 5. After etching away (major parts of) the substrate, a diffusion barrier 107 is deposited onto the flat surface of the carrier layer 101. As is shown in the partial enlargement, the diffusion barrier comprises here an aluminum nitride layer 108 covered with a pure aluminum layer 109. Of these the first-mentioned constitutes the mechanical reinforcement layer, which can carry larger mechanical loads than the carrier layer 101. Consequently it is possible to etch away parts of the carrier layer, as is shown in the lowest phase of FIG. 7, thus making the carrier layer a mesh that has openings coincident with openings of the reinforcement grid. The diffusion barrier made of layers 108 and 109 spans as a continuous film over the openings in said mesh.

A possible further development is to add collimating properties to the radiation window by depositing a layer of some heavy element to the wall surfaces of the reinforcement grid. Atomic layer deposition is a known technology, with which it is possible to produce a very thin and smooth layer of a desired substance that covers all desired surfaces in the structure regardless of their orientation.

We claim:

1. A gas tight radiation window membrane, comprising:
a membrane configured to cover and seal an opening along a radiation path in a measurement device; and
as a part of said membrane, a layered diffusion barrier that comprises a reactive metal layer covered on both sides by cover layers.

2. A gas tight radiation window membrane according to claim 1, wherein a primary constituent of said reactive metal layer is one of the following: lanthanum, lithium, cesium, barium.

3. A gas tight radiation window membrane according to claim 1, wherein said reactive metal layer consists of a compound, a constituent of which is a reactive metal.

4. A gas tight radiation window membrane according to claim 3, wherein said compound is one of the following: lanthanum oxide, cesium iodide.

5. A gas tight radiation window membrane according to claim 1, additionally comprising a mechanical reinforcement layer that is continuous over the whole area of the membrane.

6. A gas tight radiation window membrane according to claim 5, wherein said mechanical reinforcement layer is made of aluminium nitride.

7. A gas tight radiation window membrane according to claim 1, additionally comprising a carrier layer.

8. A gas tight radiation window membrane according to claim 7, comprising a reinforcement grid attached to said carrier layer.

9. A gas tight radiation window membrane according to claim 8, wherein the carrier layer is a mesh that has openings coincident with openings of said reinforcement grid, and the layered diffusion barrier spans as a continuous film over said openings in said mesh.

10. A gas tight radiation window membrane, comprising:
a carrier layer,
a gas tight diffusion barrier layer on a first side of said carrier layer, and
a reinforcement grid on a second side of said carrier layer; wherein the carrier layer is a mesh that has openings coincident with openings of said reinforcement grid, and the gas tight diffusion barrier spans as a continuous film over said openings in said mesh.

11. A gas tight radiation window membrane according claim 10, wherein said diffusion barrier comprises a reactive metal layer covered on both sides by cover layers.

12. A gas tight radiation window membrane according to claim 11, wherein a primary constituent of said reactive metal layer is one of the following: lanthanum, lithium, cesium, barium.

13. A method for manufacturing a gas tight radiation window membrane, comprising:
producing a carrier layer configured to cover and seal an opening along a radiation path in a measurement device, and
producing a layered diffusion barrier on one side of said carrier layer;
wherein producing said layered diffusion barrier comprises producing a reactive metal layer covered on both sides by cover layers.

14. A method according to claim 13, wherein:
producing the carrier layer comprises producing a continuous polymer layer,
the method comprises producing a mechanical reinforcement layer that is continuous over the whole area of the membrane, the method comprises producing a reinforcement grid on a side of said carrier layer that is different than the side on which the layered diffusion barrier and the mechanical reinforcement layer are produced.

15. A method according to claim 14, comprising removing parts of the continuous polymer layer, thus making the carrier layer a mesh that has openings coincident with openings of said reinforcement grid.

16. A method according to claim 14, wherein producing said reinforcement grid comprises:
    spreading a photosensitive polymer onto the carrier layer, and
    exposing said photosensitive polymer through an exposure mask and developing the exposed photosensitive polymer, causing desired portions of the photosensitive polymer to remain attached to the carrier layer as a reinforcement grid.

17. A method for manufacturing a gas tight radiation window membrane, comprising:
    producing a continuous polymer layer that constitutes a carrier layer,
    producing a diffusion barrier and a mechanical reinforcement layer that is continuous over the whole area of the membrane on one side of said carrier layer,
    producing a reinforcement grid on a side of said carrier layer that is different than the side on which the diffusion barrier and the mechanical reinforcement layer are produced, and
    removing parts of the continuous polymer layer, thus making the carrier layer a mesh that has openings coincident with openings of said reinforcement grid.

\* \* \* \* \*